(12) United States Patent
Choi et al.

(10) Patent No.: US 6,586,310 B1
(45) Date of Patent: Jul. 1, 2003

(54) HIGH RESISTIVITY FILM FOR 4T SRAM

(75) Inventors: Seungmoo Choi, Orlando, FL (US);
Amal M. Hamad, Orlando, FL (US);
Felix Llevada, Orlando, FL (US);
Vivek Saxena, Orlando, FL (US); Paul Yih, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/384,631

(22) Filed: Aug. 27, 1999

(65) Prior Publication Data (65)

(51) Int. Cl.[7] .............................................. H01L 27/02
(52) U.S. Cl. ...................................... 438/382; 438/238
(58) Field of Search ................................ 438/238, 239, 438/381, 382

(56) References Cited

U.S. PATENT DOCUMENTS

| 5,381,046 | A | * | 1/1995 | Cederbaum et al. ........ 257/760 |
| 5,496,762 | A | * | 3/1996 | Sandhu et al. ...... 148/DIG. 117 |
| 5,870,121 | A | * | 2/1999 | Chan ............................ 347/59 |
| 5,882,997 | A | | 3/1999 | Sur, Jr. et al. |
| 5,893,731 | A | * | 4/1999 | Lee et al. .................... 438/238 |
| 5,907,161 | A | * | 5/1999 | Ochi et al. ..................... 257/94 |
| 6,013,986 | A | * | 1/2000 | Knall et al. ................. 313/309 |
| 6,040,596 | A | * | 3/2000 | Choi et al. .................. 257/296 |
| 6,100,126 | A | | 8/2000 | Chen et al. |
| 6,127,217 | A | * | 10/2000 | Madurawe et al. ......... 438/238 |

FOREIGN PATENT DOCUMENTS

| EP | 0 320 405 | 6/1989 |
| GB | 2343787 A | 5/2000 |

* cited by examiner

Primary Examiner—Jey Tsai

(57) ABSTRACT

The present invention provides a method of manufacturing a resistor for use in a memory element and a semiconductor device employing the resistor. The method of manufacturing may comprise forming a dielectric layer over an active region of a semiconductor wafer and forming a resistive layer on the dielectric layer. The resistive layer comprises a compound wherein a first element of the compound is a Group III or Group IV element and a second element of the compound is a Group IV or Group V element. The method further comprises connecting an electrical interconnect structure to the resistive layer that electrically connects the resistive layer to the active region.

9 Claims, 2 Drawing Sheets

HIGH RESISTIVITY FILM FOR 4T SRAM

TECHNICAL FIELD OF THE INVENTION

The present invention is directed, in general, to semiconductor devices and, more specifically, to a semiconductor device having a high resistivity silicon carbide film for use with a four transistor static random access memory (4T SRAM).

BACKGROUND OF THE INVENTION

Semiconductor devices, especially those that pertain to computer and telecommunications applications, have continued to be a focus for enhancing performance. Both smaller device size and higher speed of operation are performance targets. One of the main areas of focus is in forming memory devices. Transistors have been continually reduced in size as the ability to construct smaller gate structures has improved. As the size of transistors has decreased, the size of other components have become the limiting factor in increasing overall component densities.

Resistors, especially those requiring larger values of resistance, have tended to present a problem in reducing component size. The resistance of a material, having a constant height, varies directly with the product of its electrical resistivity (also called its sheet resistance) and the ratio of its length divided by its width. Semiconductor device resistors are often formed as a serpentine planar structure having a constant width. Therefore, a resistor formed from a given material and having twice the value of another resistor formed from the same material would typically require twice the surface area or "real estate" in a semiconductor device.

Conventional semiconductor device resistor materials include polysilicon and amorphous silicon. The band gap for polysilicon is in the 1.6 eV to 1.8 eV range. Whereas for amorphous silicon, the band gap is in the 1.3 eV to 1.4 eV range. These values indicate that the resistivity of polysilicon is generally greater than the resistivity of amorphous silicon. These band gaps generally dictate that a given area of semiconductor device real estate would support larger resistor values using polysilicon than could be supported using amorphous silicon.

The thermal stability of the resistor (and therefore a selected resistor material) is another factor that impacts the choice of the material. If the material does not have sufficient thermal stability, the resistor value will vary too greatly with temperature thereby causing possible malfunction of the circuit. Additionally, poor thermal stability of the material may also contribute to a buildup of leakage currents in the semiconductor device that causes device overheating, which may lead to device failure. This is especially critical for large device-count environments such as memories.

Accordingly, what is needed in the art is a way to construct resistor components that require less device area and provide enhanced thermal characteristics.

SUMMARY OF THE INVENTION

To address the above-discussed deficiencies of the prior art, the present invention provides a method of manufacturing a resistor for use in a memory element and a semiconductor device employing the resistor. In one embodiment, the method of manufacturing comprises forming a dielectric layer over an active region of a semiconductor wafer and forming a resistive layer on the dielectric layer. The resistive layer comprises a compound wherein a first element of the compound is a Group III or Group IV element and a second element of the compound is a Group IV or Group V element. The method further comprises connecting an electrical interconnect structure to the resistive layer that electrically connects the resistive layer to the active region.

The present invention therefore introduces the pervasive concept of manufacturing a semiconductor device having a unique resistor composition. The resistor composition of the present invention permits a reduced resistor structure size that better accommodates a larger number of smaller device geometries thereby improving overall device densities. The radiation hardness of the resistor composition is also greatly improved over the use of single, poly or amorphous silicon. Additionally, the resistor composition affords more thermal stability and allows a broader temperature operating range than single, poly or amorphous silicon.

In an embodiment to be illustrated and described, forming a resistive layer includes forming a silicon carbide layer. The silicon carbide layer may be formed with physical vapor deposition. Alternately, forming the resistive layer includes employing chemical vapor deposition. Using chemical vapor deposition includes forming the resistive layer with a forming gas containing silicon and carbon, such as silane ($SiH_4$) and methane ($CH_4$), having a gas flow ranging from about 1 standard cubic centimeter per minute (sccm) to about 20 sccm, a pressure ranging from about 5 torr to about atmospheric, and a temperature ranging from about 700° C. to about 950° C. Of course, the use of any current or future developed deposition process and appropriate deposition material are well within the broad scope of the present invention.

A resistive layer, in an alternate embodiment, may be formed using a gallium nitride layer. Other appropriate compounds may be selected, by one skilled in the appropriate art, to form a resistive layer having a band gap of at least about 2 eV. An amorphous resistive layer may be formed, in yet another embodiment of the present invention. Forming the amorphous resistive layer includes forming the resistive layer at a temperature of about 25° C. Additionally, forming a resistive layer may include using a pressure ranging from about 2 millitorr to about 10 millitorr. Of course other temperatures and pressures are well within the scope of the present invention.

Forming a semiconductor device on a semiconductor wafer substrate, in an alternate embodiment, comprises forming an active region in the semiconductor wafer substrate, which includes a gate on the semiconductor wafer substrate. A dielectric layer is formed over the active region and gate. A resistive layer is formed over the dielectric layer and is comprised of a compound wherein a first element of the compound is a Group III or Group IV element and a second element of the compound is a Group IV or Group V element. An electrical interconnect structure is connected to the resistive layer that electrically connects the resistive layer to the active region.

In another aspect, the present invention provides a semiconductor device formed on a semiconductor wafer, comprising a transistor located on the semiconductor wafer, and a dielectric layer located over the transistor. The resistor includes resistive layer located over the dielectric layer. The resistive layer comprises a compound wherein a first element of the compound is a Group III or Group IV element and a second element of the compound is a Group IV or Group V element. An interconnect structure electrically connects the resistor to the transistor.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
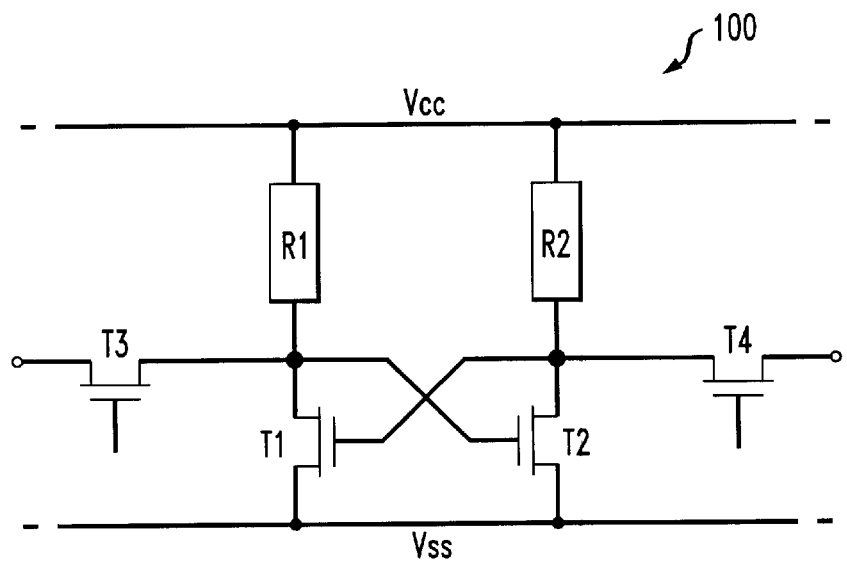
FIG. 1 illustrates a schematic diagram of a 4T SRAM element.

Referring initially to FIG. 1, illustrated is an electrical schematic diagram of a 4T SRAM element 100. The 4T SRAM element 100 preferably includes first, second, third and fourth transistors T1, T2, T3, T4 and first and second resistors R1, R2. The 4T RAM element 100 uses first and second supply voltages Vcc, Vss. The first transistor T1 and the second transistor T2 have gates that are cross-connected to opposite transistor drains to form a latch circuit thereby providing memory for the element. The third transistor T3 and the fourth transistor T4 provide access that establishes and communicates the memory state of the element. The relative simplicity of the 4T SRAM structure, which is composed of only two different circuit units, makes it extremely efficient to construct semiconductor memory devices requiring a large number of elements.

The first and second resistors R1, R2 in the past have been conventionally formed from single, poly or amorphous silicon, as discussed earlier. The semiconductor device area required to achieve a desired design value of resistance, using these forms of silicon, is often quite large relative to the other devices in the element. As transistor devices continue to shrink in size, these resistors may quickly become the components limiting further effective increase in memory element density. However, as discussed below, the resistor's R1 and R2 of the 4T SRAM functional design may be greatly improved by the present invention.

Figure 2:
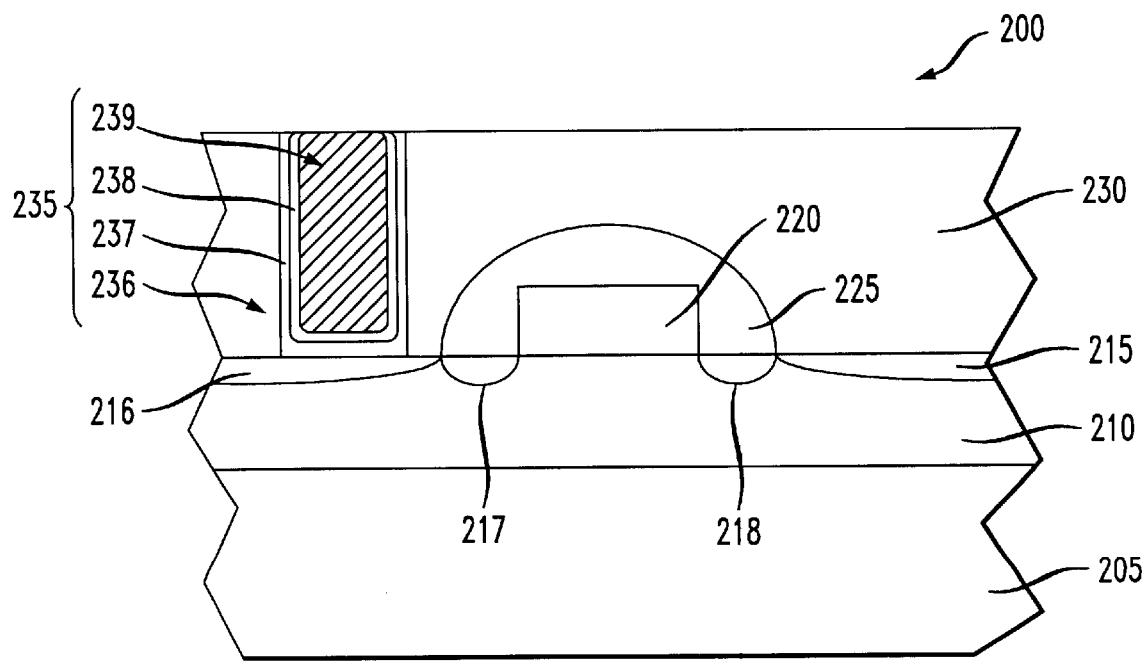
FIG. 2 illustrates a diagram of a transistor structure that may be employed in a 4T SRAM element.

Turning now to FIG. 2, illustrated is a diagram of a an intermediate device that includes a transistor structure 200 that may be employed in the 4T SRAM 100. The transistor structure 200 includes a conventionally formed semiconductor wafer substrate 205 and an active region 210. The active region 210 preferably includes source 215, a drain 216 and first and second lightly doped areas 217, 218, a gate 220, a gate dielectric 225, a dielectric layer 230 and a contact structure 235 having a contact plug 239 and a barrier layer 236 with first and second barrier layers 237, 238.

The contact structure 235 is used to electrically connect the drain 216 of the active region 210 to other circuit components in the semiconductor wafer. The barrier layer 236 may employ titanium as the first barrier element 237 and titanium nitride as the second barrier element 238 where the contact plug 239 is either tungsten or aluminum. Alternately, the barrier layer 236 may employ tantalum as the first barrier element 237 and tantalum nitride as the second barrier element 238 where the contact plug 239 is copper.

Figure 3:
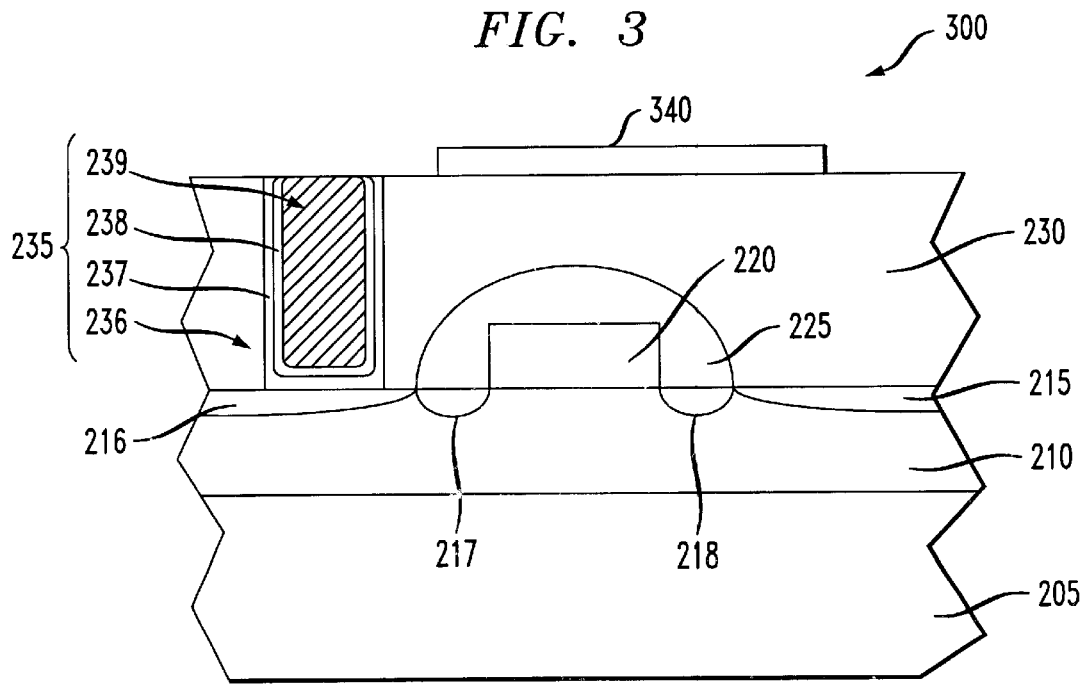
FIG. 3 illustrates a diagram of a circuit showing the transistor structure of FIG. 2 and an embodiment of a resistive layer constructed according to the principles of the present invention.

Turning now to FIG. 3, illustrated is a diagram of a circuit 300 showing an embodiment of a resistive layer constructed according to the principles of the present invention. The circuit 300 includes the transistor structure 200 discussed in FIG. 2 and a resistive layer 340 positioned over the dielectric layer 230, as shown. The resistive layer 340 forms a resistor for use as a component in the construction of desired electrical circuits. The present embodiment provides a method of manufacturing such a resistor for use in a memory element and a semiconductor device employing the resistor.

The method of manufacturing comprises forming the dielectric layer 230 over the active region 210 of the semiconductor wafer. The dielectric layer 230 is formed by conventional deposition processes, such as a chemical vapor deposition of tetraethyl ortho silicate. Following the formation of the dielectric layer 230, the resistive layer 340 is formed on the dielectric layer 230. The resistive layer 340 comprises a compound wherein a first element of the compound is a Group III or Group IV element and a second element of the compound is a Group IV or Group V element. For example, the resistive layer may include compounds, such as silicon carbide, gallium nitride, aluminum nitride, boron nitride or titanium carbide.

The resistive layer 340 is preferably formed by a physical vapor deposition process conducted at a temperature ranging from about 20° C. to about 50° C. and at a pressure ranging from about 5 millitorr to about 50 millitorr in an environment including 10 to 20 millitorr argon and 5 to 10 millitorr of hydrogen. The preferred radio frequency power is about 60 to 90 watts. However, chemical vapor deposition (CVD) may also be used to deposited the resistive layer 340. In such embodiments, the CVD process may include forming the resistive layer 340 with a forming gas containing silicon and carbon, such as Silane ($SiH_4$) and methane ($CH_4$), having a gas flow ranging from about 1 standard cubic centimeter per minute (sccm) to about 20 sccm, a pressure ranging from about 5 torr to about atmospheric, and a temperature ranging from about 700° C. to about 950° C. Of course, the use of any current or future developed deposition process and appropriate deposition material are well within the broad scope of the present invention. After the its deposition, the resistive layer 340 may be patterned and formed using conventional photolithographic processes.

In an advantageous embodiment, the resistive layer 340 comprises silicon carbide. Preferably the silicon carbide has a stoichiometry of silicon to carbon of about 1:1. The layer of silicon carbide comprising the resistive layer 340 may be formed through physical vapor deposition or through chemical vapor deposition, as discussed above.

As previously mentioned, another example of the compounds employed in formation of the resistive layer 340 may be gallium nitride. Other appropriate compounds including the above-discussed groups and having a bandgap of at least about 2 eV may also be selected to form the resistive layer 340. A band gap of this magnitude is necessary to produce the increased resistivity or sheet resistance needed to allow a smaller sized resistive layer to be constructed. An amorphous resistive layer 340 may also be formed using a forming temperature of about 25° C. Of course, other temperatures and pressures are well within the scope of the present invention.

Figure 4:
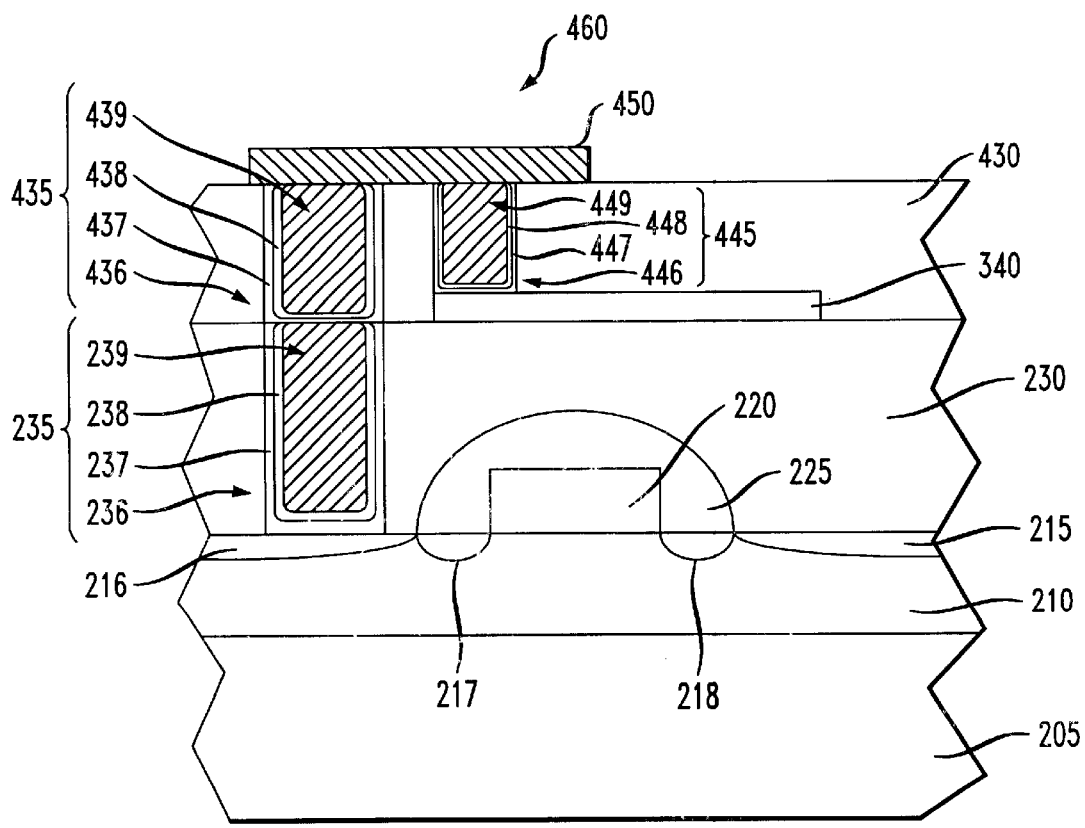
FIG. 4 illustrates a diagram of a circuit showing the circuit of FIG. 3 and a resistive layer interconnect structure.

Turning now to FIG. 4, illustrated is a diagram of a circuit 400 showing one way in which the resistive layer 340 may be connected to the transistor 230. In this particular embodiment, the circuit 400 includes the circuit 300 discussed in FIG. 3, a dielectric layer 430 and an electrical interconnect structure 460. The electrical interconnect structure 460 preferably includes a contact structure 235 that is electrically connected to a first via structure 435, an interconnect trace 450 and a second via structure 445. The first via structure 435 is electrically connected to an interconnect trace 450 that is electrically connected to a second via structure 445. As shown, the second via structure 445 is electrically connected to the resistive layer 340. The first via structure 435 includes a barrier layer 436 with first and second barrier elements 437, 438 and a via plug 439, and the second via structure 445 includes a barrier layer 446 with first and second barrier elements 447, 448 and a via plug 449. The contact structure 235, the first via structure 435, the interconnect trace 435 and the second via structure 445 are all formed with conventional materials and by conventional deposition processes.

The electrical interconnect structure 460 is used to electrically connect the resistive layer 340 to the drain 216 in the active region 210. The first and second via structures 435, 445 may be constructed using the combinations of materials that pertain to the contact structure 235 as discussed under FIG. 2. Of course, connection to other circuit components through the interconnect trace 450 may also be accomplished, as the design dictates, wherein the semiconductor wafer includes a plurality of transistors and a plurality of resistors that are electrically interconnected to form a memory element. Although this embodiment has focused on the use of the invention in a memory element application of which the 4T SRAM is exemplary, other applications are well within the broad scope of the present invention.

Although the present invention has been described in detail, those skilled in the art should understand that they can make various changes, substitutions and alterations herein without departing from the spirit and scope of the invention in its broadest form.

What is claimed is:

1. A method of forming a planar resistor, comprising:
   forming a dielectric layer over an active region of a semiconductor wafer; and
   forming a resistive layer on the dielectric layer, the resistive layer consisting of gallium nitride and configured to allow a current flow in a substantially horizontal plane; and
   connecting an electrical interconnect structure to the resistive layer that electrically connects the resistive layer to the active region.

2. The method as recited in claim 1 wherein forming a resistive layer includes forming an amorphous resistive layer.

3. The method as recited in claim 2 wherein forming an amorphous resistive layer includes forming the resistive layer at a temperature of about 25° C.

4. The method as recited in claim 1 wherein forming a resistive layer includes forming the resistive layer at a pressure of ranging from about 5 millitorr to about 50 millitorr.

5. The method as recited in claim 1 wherein forming a resistive layer includes forming the resistive layer with chemical vapor deposition.

6. The method as recited in claim 5 wherein forming the resistive layer with a forming gas having a gas flow ranging from about 1 standard cubic centimeter per minute (sccm) to about 20 sccm, a pressure ranging from about 5 torr to about atmospheric, and a temperature ranging from about 700° C. to about 950° C.

7. A method of forming a semiconductor device on a semiconductor wafer substrate, comprising:
   forming an active region in and a gate on the semiconductor wafer substrate;
   forming a dielectric layer over the active region and gate;
   forming a planar resistor over the semiconductor wafer substrate, including:
      forming a resistive layer over the dielectric layer, the resistive layer consisting of gallium nitride and configured to allow a current flow in a substantially horizontal plane; and
   connecting an electrical interconnect structure to the resistive layer that electrically connects the resistive layer to the active region.

8. The method as recited in claim 7 wherein forming a resistive layer includes forming an amorphous resistive layer.

9. The method as recited in claim 7 wherein forming the resistive layer with a forming gas having a gas flow ranging from about 1 standard cubic centimeter per minute (sccm) to about 20 sccm, a pressure ranging from about 5 torr to about atmospheric, and a temperature ranging from about 700° C. to about 950° C.

* * * * *